(12) United States Patent
Stockum et al.

(10) Patent No.: US 9,379,326 B2
(45) Date of Patent: Jun. 28, 2016

(54) SELECTIVE ETCHING OF A MATRIX COMPRISING SILVER NANO WIRES

(71) Applicant: MERCK PATENT GmbH, Darmstadt (DE)

(72) Inventors: Werner Stockum, Reinheim (DE); Oliver Doll, Dietzenbach (DE); Ingo Koehler, Reinheim (DE); Christian Matuschek, Frankfurt am Main (DE)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 14/354,743

(22) PCT Filed: Sep. 28, 2012

(86) PCT No.: PCT/EP2012/004095
§ 371 (c)(1),
(2) Date: Apr. 28, 2014

(87) PCT Pub. No.: WO2013/060409
PCT Pub. Date: May 2, 2013

(65) Prior Publication Data
US 2014/0291287 A1    Oct. 2, 2014

(30) Foreign Application Priority Data
Oct. 27, 2011    (EP) .................................... 11008621

(51) Int. Cl.
*H01B 13/00*        (2006.01)
*C03C 25/68*        (2006.01)
(Continued)

(52) U.S. Cl.
CPC ............ *H01L 51/0017* (2013.01); *C09K 13/06* (2013.01); *C23F 1/00* (2013.01);
(Continued)

(58) Field of Classification Search
CPC ............ H01L 51/0017; H01L 51/0023; H01L 51/102; H01L 51/5206; H01L 51/5231; H01L 51/5234; H01L 31/02168; H01L 31/1804; H01L 21/31111; H01L 31/18; H01L 31/1884; H01L 31/022425; C09K 13/04; C09K 13/06; C09K 13/08; C03C 15/00; C03C 17/23; C03C 17/3411; C03C 2218/33; Y02E 10/547; Y02E 10/50; B82Y 10/00
USPC ............. 216/83, 13, 99, 108, 89, 96, 97, 100, 216/109, 24, 37, 42, 51, 74, 79, 80; 252/79.1, 79.4; 257/E21.006, E21.077; 438/745, 738, 754
See application file for complete search history.

(56) References Cited

U.S. PATENT DOCUMENTS

| 8,617,418 B2 | 12/2013 | Sekiguchi et al. |
| 2004/0063326 A1* | 4/2004 | Szlufcik et al. ................ 438/695 |

(Continued)

FOREIGN PATENT DOCUMENTS

| WO | 2010113744 A1 | 10/2010 |
| WO | 2011032629 A1 | 3/2011 |

(Continued)

OTHER PUBLICATIONS

International Search Report for PCT/EP2012/004095 dated Oct. 26, 2012.

(Continued)

*Primary Examiner* — Nadine Norton
*Assistant Examiner* — Christopher Remavege
(74) *Attorney, Agent, or Firm* — Millen, White, Zelano, Branigan, P.C.

(57) ABSTRACT

The present invention refers to a method for selectively structuring of a polymer matrix comprising AgNW (silver nano wires) or CNTs (carbon nano tubes) or comprising mixtures of AgNW and CNTs on a flexible plastic substructure or solid glass sheet. The method also includes a suitable etching composition, which allows to proceed the method in a mass production.

23 Claims, 2 Drawing Sheets

Figure 1:
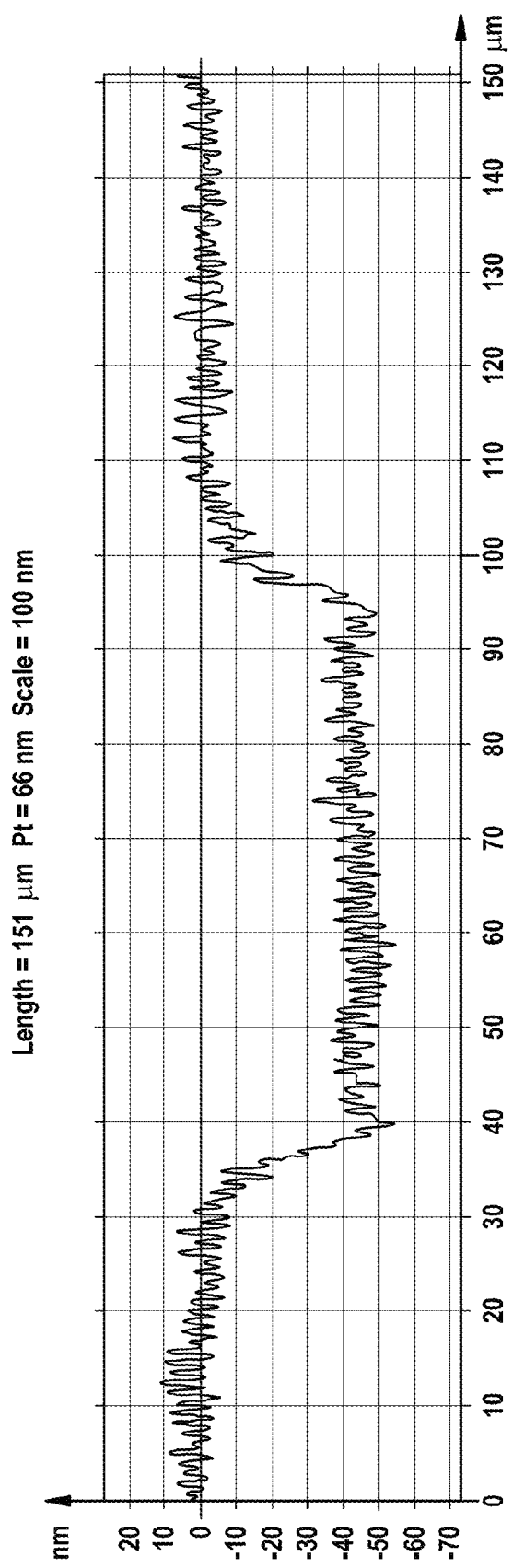

(51) Int. Cl.
- *H01L 51/00* (2006.01)
- *H01B 1/22* (2006.01)
- *H01L 51/10* (2006.01)
- *H01L 51/52* (2006.01)
- *H01L 33/42* (2010.01)
- *H01L 31/18* (2006.01)
- *C09K 13/06* (2006.01)
- *C23F 1/00* (2006.01)
- *C23F 1/30* (2006.01)
- *C23F 1/02* (2006.01)

(52) U.S. Cl.
CPC .. *C23F 1/02* (2013.01); *C23F 1/30* (2013.01); *H01B 1/22* (2013.01); *H01L 31/1888* (2013.01); *H01L 33/42* (2013.01); *H01L 51/0023* (2013.01); *H01L 51/102* (2013.01); *H01L 51/5231* (2013.01); *H01L 51/5234* (2013.01); *H01L 51/0019* (2013.01); *H01L 2251/5369* (2013.01); *Y02E 10/50* (2013.01)

(56) References Cited

U.S. PATENT DOCUMENTS

| | | | |
|---|---|---|---|
| 2010/0200539 A1* | 8/2010 | Yun et al. | 216/13 |
| 2011/0253668 A1* | 10/2011 | Winoto et al. | 216/13 |
| 2012/0031872 A1 | 2/2012 | Sekiguchi et al. | |
| 2012/0181668 A1 | 7/2012 | Doll et al. | |
| 2012/0295393 A1* | 11/2012 | Lu | H01L 27/1421 438/73 |
| 2013/0065359 A1 | 3/2013 | Stockum et al. | |
| 2014/0021400 A1* | 1/2014 | Coenjarts | 252/79.4 |

FOREIGN PATENT DOCUMENTS

| | | |
|---|---|---|
| WO | 2011119707 A2 | 9/2011 |
| WO | 2011144292 A2 | 11/2011 |

OTHER PUBLICATIONS

De, S. et al., "Silver nanowire networks as flexible, transparent, conducting films: Extremely High DC to Optical Conductivity Ratios," ACS Nano, 2009, vol. 3, No. 7, pp. 1767-1774.

Liqiang, Y. et al., "Solution-processed flexible polymer solar cell with silver nanowire electrodes," Curriculum of Applied Sciences and Engineering, 2011.

* cited by examiner

SELECTIVE ETCHING OF A MATRIX COMPRISING SILVER NANO WIRES

FIELD OF THE INVENTION

The present invention refers to a method for a selective structuring of a polymer matrix comprising AgNW (silver nano wires) on a flexible plastic substructure or glass sheet. The method also includes a suitable etching composition for carrying the method out in the mass production.

BACKGROUND OF THE INVENTION/STATE OF THE ART

Transparent conductive films are very important for many electronic devices and components. They are mostly used for electrode applications in devices such as liquid crystals, flat panels or plasma displays, touch panels, organic light emitting diodes (OLED) and solar cells. Such films especially are used for thin film cells, organic polymer cells (OPC) and dye-sensitized solar cells.

Transparent conductive film materials are usually made from doped metal oxides, most commonly indium tin oxide (ITO). However ITO has a number of drawbacks and is unlikely to be the material of choice in future optoelectronic devices.

The problems with ITO films and layers revolve around the cost of indium, its material performance and process conditions used in their production. The latter two issues become more significant, due to the increase of display sizes in the future and the use of flexible plastic film materials instead of glass. The new types of displays have to be very flexible and have to include transparent electrodes which can be produced at low temperature and low costs, and if desired have to be of very large size. In top these display have to have a low sheet resistance and high transparency.

It is straightforward to achieve sheet resistance of about 10 Ohm/sq for transmittance of >90% with ITO.

Alternative materials are under investigation since several years. In order to catch the ITO level, new nanostructure thin film materials are in focus of new TC (transparent conductive) materials. Graphene and carbon nano tube films have been studied. However, the main issue is still the sheet resistance and high transparency.

Another group of new nanostructure thin film materials are silver nanowires films (AgNW). Latest results did show very promising results in comparison with ITO standard. It was possible to achieve a sheet resistance of about 13 Ohm/sq for transmittance of 85%. Therefore, it is expected a wide implementation of the AgNW technology for display and photovoltaic market in future due to a simplified production of these nanomaterials and a low cost deposition method on plastic-film or glass substrates. (Sukanta, D.; Thomas, M. H.; Philip, E. L.; Evelyn, M. D.; Peter, N. N.; Werner, J. B.; John, J. B.; Jonathan, N. C., (2009). "Silver Nanowire Networks as Flexible, Transparent, Conducting Films: Extremely High DC to Optical Conductivity Ratios". American Chemical Society.

The solar power market has continuously grown and the ability to create high-efficiency solar cells is a key strategy to meet the growing world energy needs. Today's photovoltaic systems are predominantly based on the use of crystalline silicon, thin-film and concentrator photovoltaic technologies.

Thin-film technologies have lower efficiencies than crystalline silicon cells but permit the direct deposition to a surface that can be made of a flexible polymer material or plastic. Thin-film technology reduces the costs of the end product because it allows to use smaller amounts of semiconductor material, while the manufacturing is done in a continuous process, and it results in a product that is less likely to be damaged during transportation.

Thus, a promising low cost alternative product in comparison to silicon solar cells or semiconductor devices can be found in organic photovoltaic devices (OPVs) as well, if their power conversion efficiency can be increased (Liquing, Y.; Tim, Z.; Huaxing, Z.; Samuel, C. P.; Benjamin J. W.; Wei, Y., (2011). "Solution-Processed Flexible Polymer Solar Cell with Silver Nanowire Electrodes". Curriculum of Applied Sciences and Engineering.

Organic (polymer-based) solar cells are flexible, and according to the current state of development, their production costs are about a third of the price of silicon cells. They are disposable and can be designed on a molecular level. Current research is focusing on the improvement in efficiency and on the development of high-quality protective coatings in order to minimize the environmental effects.

According to the current state of the art, in a Silver-Nanowire-, or Carbon-Nanotube-, or a polymer based substrate any desired structure can be etched selectively and directly by laser-supported etching methods or, after masking, by wet-chemical methods or by dry-etching methods.

In laser supported etching methods the laser beam scans the entire etch pattern dot by dot or line by line in the case of vector-orienting systems, on the substrate, which, in addition to a high degree of precision, also requires considerable adjustment effort and is very time-consuming.

OBJECT AND SUMMARY OF THE INVENTION

The wet-chemical and dry etching methods include material-intensive, time-consuming and expensive process steps:
A. masking of the areas not to be etched, for example by photolithography:
   production of a negative or positive of the etch structure (depending on the resist), coating of the substrate surface (for example by spin-coating with a liquid photoresist), drying of the photo-resist, exposure of the coated substrate surface, development, rinsing, if desired drying
B. etching of the structures by:
   dip methods (for example wet etching in wet-chemical banks):
   dipping of the substrates into the etch bath, etching process, repeated rinsing in $H_2O$ cascade basins, drying
   spin-on or spray methods:
   the etching solution is applied to a rotating substrate, the etching operation can take place without/with input of energy (for example IR or UV irradiation),
   or known dry-etching methods as there are for example, plasma etching in expensive vacuum units or etching with reactive gases in flow reactors and
C. In the final process step, the photoresist covering the protecting areas of the substrate must be removed. This can be carried out by means of solvents, such as, for example, acetone, or dilute aqueous alkaline solutions. The substrates are finely rinsed and dried.

This last step involves the risk, that polymer layers comprising AgNW or CNT (carbon nano tubes) or mixtures thereof are affected by solvents or acidic solutions or that the layered material is delaminated.

Dry etching method of TC (transparent conductive) layers is also known, using a patterned masking layer and etching the thin conductive film in a plasma etch chamber using boron trichloride ($BCl_3$) and dichloride ($Cl_2$) and a substrate bias power.

Since these etching methods are time consuming and expensive, experiments were carried out to etch AgNW comprising layers by exposure to applied pasty etching compositions at elevated temperatures or by exposure of thermal radiation or infrared radiation. Unexpectedly it was found by these experiments that AgNW comprising layers can be etched selectively and uniform with high throughput by use of an acidic based etching paste, such that this method can be applied for the treatment of AgNW comprising layers for mass production of flexible photovoltaic devices and comparable products, like touch panels, displays (LCD) or solar-cells.

Therefore, the object of the present invention is a method for selective etching of a polymer matrix comprising silver nanowires (AgNWs) or carbon nano tubes (CNTs) or mixtures thereof on a plastic substructure and/or on a glass sheet, which comprises the steps of a) printing an acidic etching paste onto the surface of a composite material, b) etching for a predetermined period of time (fixed dwell time) and c) cleaning the substrate.

In step a) preferably an etching paste is printed onto the surface of the composite material, which comprises an etchant selected from the group $NH_4HF_2$, $NH_4F$, $HF$, $HBF_4$ or $H_3PO_4$ The applied paste composition may comprise a solvent, selected from the group water, mono- or polyhydric alcohols, such as glycerol, 1,2-propanediol, 1,2-Ethandiol, 2-Propanol, 1,4-butanediol, 1,3-butanediol, 1,5-pentanediol, 2-ethyl-1-hexenol, ethylene glycol, diethylene glycol and dipropylene glycol, and ethers thereof, such as ethylene glycol monobutyl ether, triethylene glycol monomethyl ether, diethylene glycol monobutyl ether and dipropylene glycol monomethyl ether, and esters, such as [2,2-butoxy(ethoxy)]ethyl acetate, isopropyl acetate, isopropyl formate, esters of carbonic acid, such as propylene carbonate, ketones, such as acetone, 2-butanon, acetophenone, methyl-2-hexanone, 2-octanone, 4-hydroxy-4-methyl-2-pentanone and 1-methyl-2-pyrrolidone, caprolactam, 1,3.Dioxolan, 2-Methyl-1,3-Dioxolan, aldehyds, such as Acetaldehyd, as such or in a mixture.

In a most preferred embodiment the etching paste comprises ethylene glycol as solvent. The solvent may be contained in an amount of from 10 to 90% by weight, preferably in an amount of from 15 to 85% by weight, based on the total amount of the medium.

In a particular embodiment the applied etching paste comprises organic or inorganic filler particles or mixtures thereof.

The applied etching paste preferably comprises inorganic or organic particles or mixtures thereof as filler and thickener. The polymer particles may be selected from the group of polystyrenes, polyacrylics, polyamides, polyimides, polymethacrylates, melamine, urethane, benzoguanine and phenolic resins, silicone resins, micronised cellulose and fluorinated polymers (PTFE, PVDF, inter alia) and micronised wax (micronised polyethylene wax). The inorganic particles may be selected from the group of aluminium oxides, calcium fluoride, boron oxide, carbon black, graphite, fumed silica and sodium chloride and may act as filler and thickener.

Suitable etching pastes according to the present invention comprise the particulate organic or inorganic fillers or mixtures thereof and thickeners homogeneously distributed in amounts of from 0.5 to 25% by weight, based on the total amount of the etching medium.

According to the present invention the etching paste may be applied to the surface by screen printing, inkjet printing, dispensing or micro-jetting.

When the etching paste is applied to the surface to be etched it is removed again after a reaction time of 10 s-15 min, preferably after 30 s to 7 min. In a most preferred embodiment of the inventive method the etching paste is removed after a reaction time of 1 minute.

Usually the etching is carried out at elevated temperatures in the range from 20-170° C., preferably in the range from 20 to 60° C. and very particularly preferably from 20 to 30° C. In a preferred embodiment the substrate is heated for 5 minutes to a temperature of 30° C. When the etching is completed, the treated substrate is rinsed with DI water or with a suitable solvent, and the rinsed part is dried with dry air or nitrogen flow.

The new method disclosed herein is especially suitable for the etching of composite materials showing polymer layers comprising AgNW (silver nano wires) on plastic substructures, especially on polyurethane, PEN or PET and/or glass sheets. The silver nano wires may be replaced by carbon nano tubes (CNTs) or silver nano wires may be combined with carbon nano tubes.

Said AgNWs, which are embedded in the polymer layers, build conductive layers with different thickness, density, sheet resistance and transmittance. The embedded AgNWs have a length variation of 1.5 to 15 μm and the diameter varies in the range of 40-150 nm. Suitable CNTs are described in detail in the earlier patent application having the filing number WO PCT/EP2011/002085.

Preferably the AGNWs and CNTs are embedded in conductive polymers selected from the group poly(3-octylthiophene) (P3OT), poly(3-hexyl-thiophene)polymer (P3HT), poly(3,4-ethylene dioxythiophene), or other polythiophene derivatives and polyanilines, or is a combination of polymers like poly[2-methoxy-5-(3',7'-dimethyloctyloxy)1,4-phenylene vinylene] (MDMO-PPV)/1-(3-methoxycarbonyl)-propyl-1-phenyl)[6,6]$C_{61}$ (PCBM); poly(3-hexyl-thiophene) polymer (P3HT)/(PCBM) and poly(3,4-ethylene dioxythiophene)/poly(styrene sulfonate) (PEDOT/PSS).

As such the new method enables to etch said layers with a resolution of the printed lines, points or structures of less than 80 μm, usually the resolution is substantially higher.

DETAILED DESCRIPTION OF THE PRESENT INVENTION

The disadvantages of the conventional etching methods as described before are time-consuming, material-intensive and include expensive process steps. On top of this, these known etching methods are in some cases complex in view of the technical performance, safety, and are carried out batch-wise.

Therefore, the objective of the present invention is to provide a new etching composition, which is suitable to be employed in a simplified etching method for polymer-surfaces. It is also an objective of the present invention to provide an improved etching method for polymer-surfaces, which can be carried out with throughputs as high as possible, and which is significantly less expensive than conventional wet and dry etching methods in the liquid or gas phase.

Surprisingly, experiments have shown that difficulties due to the comprising AgNW material may be overcome by the etching method according to the present invention and rough surface topographies of AgNW materials as described above may be etched to smooth and even surfaces at the bottom of etched lines and structures, if depending on the nature of the layers, which have to be etched, the conditions of etching are suitable. If desired, only AgNWs comprising polymer layers of the treated composite material may be patterned by the etching method according to the present invention. But if also the plastic substructure has to be etched by an etching step, the conditions of etching and the applied etching composition may be changed. These experiments have also shown, that comparable materials comprising carbon nano tubes (CNTs) instead of AgNWs or in combination with them are also etched with comparable good results.

In addition to this, it was found, that advantageously according to the present invention the suitable etching pastes can be applied with high resolution and precision in a single process step onto the substrate surface at areas to be etched. There is no need for a previous protection with a photoresist layer on areas, which have to stay unchanged.

Thus, a method with a high degree of automation and high throughput is provided, which is suitable for the transfer of the etching paste to the substrate surface to be etched using a printing technology. In particular, printing technologies like screen printing, silk-screen printing, pad printing, stamp printing, gravure printing, microjet-printing and ink-jet printing methods are printing methods which are known to the person skilled in the art, but dispensing and manual application are possible as well.

In particular the present invention refers to a method of selectively etching a polymer matrix comprising AgNWs (silver nano wires) on glass sheets or a plastic substructure, preferably on a substructure consisting of polyethylene terephthalate (PET), polyethylene naphthalate (PEN) or polyurethane. The etching paste is printed on the substrate. Etching starts immediately after printing. At once the substrate is heated to a temperature of about 20° C. to 170° C., preferably to about 20 to 60° C. The temperature is kept for about 10 s to 15 minutes, preferably for 30 s to 7 minutes. In a most preferred embodiment the elevated temperature is kept for 1 minutes at 30° C. Then the etching step is stopped by cleaning with a suitable solvent. Preferably the surface is rinsed with DI water. But in detail the term of heating, the kept temperature and the cleaning has to be adapted to the special nature of the glass sheet or polymer matrix comprising AgNWs and to that of the substructure underneath. The etching results of the same polymer matrices but comprising CNTs either alone or in combination with AgNWs are comparable.

As such the glass sheet or polymer matrix, the comprising AgNWs and possibly the CNTs are etched by use of a paste comprising a solvent, an acidic etchant solution in water, like $NH_4HF_2$, $NH_4F$, HF, $HBF_4$ or $H_3PO_4$ and further comprising at least a thickener and/or organic filler. The thickener and organic filler may be the same or different and may be inorganic or organic polymer particles, or mixtures thereof.

In addition to these main ingredients the etching composition may comprise further additives, such as antifoams, thixotropic agents, flow-control agents, deaerators or adhesion promoters for an improved manageability and processability.

In general the etching paste compositions according to the invention comprise a solvent selected from the group water, mono- or polyhydric alcohols, such as glycerol, 1,2-propanediol, 1,2-Ethandiol, 2-Propanol, 1,4-butanediol, 1,3-butanediol, 1,5-pentanediol, 2-ethyl-1-hexenol, ethylene glycol, diethylene glycol and dipropylene glycol, and ethers thereof, such as ethylene glycol monobutyl ether, triethylene glycol monomethyl ether, diethylene glycol monobutyl ether and dipropylene glycol monomethyl ether, and esters, such as [2,2-butoxy(ethoxy)]ethyl acetate, isopropyl acetate, isopropyl formate, esters of carbonic acid, such as propylene carbonate, ketones, such as acetone, 2-butanon, acetophenone, methyl-2-hexanone, 2-octanone, 4-hydroxy-4-methyl-2-pentanone and 1-methyl-2-pyrrolidone, caprolactam, 1,3.Dioxolan, 2-Methyl-1,3-Dioxolan, aldehyds, such as Acetaldehyd, as such or in a mixture. In a most preferred embodiment the etching paste comprises ethylene glycol as solvent. The solvent may be contained in an amount of from 10 to 90% by weight, preferably in an amount of from 15 to 85% by weight, based on the total amount of the medium.

If the etching compositions according to the invention comprise thickeners,
    these may be selected from the group
    cellulose/cellulose derivatives and/or
    starch/starch derivatives and/or
    xanthan and/or
    polyvinylpyrrolidone
    polymers based on acrylates of functionalised vinyl units.
In general thickeners like this are commercially available.

The prepared etching compositions show at a temperature of 20° C. viscosities in the range of 6 to 45 Pa·s at a shear rate of 25 s$^{-1}$, preferably in the range from 10 to 25 Pa·s at a shear rate of 25 s$^{-1}$ and very particularly preferably from 15 to 20 Pa·s at a shear rate of 25 s$^{-1}$.

Additives having advantageous properties for the desired purpose are for example antifoams, like TECO® Foamex N which is commercially available,
    thixotropic agents, such as BYK® 410, Borchigel® Thixo2,
    flow-control agents, such as TECO® Glide ZG 400,
    deaeration agents, such as TECO® Airex 985, and
    adhesion promoters, such as Bayowet® FT 929.

These additives have a positive effect on the printability of the printing paste.

The proportion of the additives is in the range from 0 to 5% by weight, based on the total weight of the etching paste.

The method and the paste composition according to the present invention are particularly useful for dispensing or printing of an especially suitable etching composition and selectively etching of small structures on plastic substrates. Unexpected for a skilled worker this method is suitable for the etching of polymer layers comprising AgNWs and possibly CNTs and for the etching of the supporting plastic substructure if desired.

The edge sharpness of the etched patterns and the depth of etching in the polymer-based substrates and their layers of variable thickness can be adjusted by variation of the following parameters:
    concentration and composition of the etching components
    concentration and composition of the solvents
    concentration and composition of the thickener systems
    concentration and composition of the filler content
    concentration and composition of any additives added, such as antifoams, thixotropic agents, flow-control agents, deaeration agents and adhesion promoters
    viscosity of the printable etching paste as described in accordance with the invention
    time of etching with or without input of energy into the etching paste and/or the to be etched substrate
    etching temperature The time of etching can last for a few seconds or for several minutes. This depends on the application, desired etching depth and/or edge sharpness of the etch structures. In general, the etching time is in the range of between a few seconds and 10 minutes, but if necessary the time may be extended.

According to a preferred embodiment of the present invention the printable etching composition is an acidic etching paste, which is prepared by simply mixing the ingredients, as there are the etchant, solvent, thickener and filler content.

The surface to be etched here can be a surface or part-surface of transparent, conductive polymer layer comprising AgNWs and possibly CNTs on a support material consisting of flexible plastic or glass sheet. The transparent, conductive polymer may be a polymer selected from the group poly(3-octylthiophene) (P3OT), poly(3-hexyl-thiophene) polymer (P3HT), poly(3,4-ethylene dioxythiophene), or other polythiophene derivatives and polyanilines. The transparent, conductive polymer layer may also comprise a combination of polymers like poly[2-methoxy-5-(3',7'-dimethyloctyloxy)1,4-phenylene vinylene] (MDMO-PPV)/1-(3-methoxycarbonyl)-propyl-1-phenyl)[6,6]$C_{61}$ (PCBM); poly(3-hexyl-thiophene)polymer (P3HT)/(PCBM);

poly(3,4-ethylene dioxythiophene)/poly(styrene sulfonate) (PEDOT/PSS), wherein the nano tubes or nano wires like AgNWs and CNTs are embedded.

A suitable process having a high degree of automation and having high throughput utilises printing technologies to transfer the etching paste to the substrate surface to be etched. In particular, the screen, pad, stamp, ink-jet printing processes are printing processes that are known to the person skilled in the art. Manual application is likewise possible.

Depending on the screen, plate or stamp design or cartridge addressing, it is possible to apply the etching pastes having non-Newtonian flow behaviour which are described in accordance with the invention over the entire area or selectively in accordance with the etch structure pattern only in the areas where etching is desired. All masking and lithography steps which are otherwise necessary are thus superfluous. The etching operation can be carried out with or without energy input, for example in the form of heat radiation (using IR lamps).

The actual etching process is subsequently completed by washing the surfaces with water and/or a suitable solvent. More precisely, the printable, polymer particle-containing etching pastes having non-Newtonian flow behaviour are rinsed off the etched areas using a suitable solvent when the etching is complete.

The use of the etching pastes according to the invention thus enables long runs to be etched inexpensively on an industrial scale in a suitable, automated process.

In a preferred embodiment, the etching paste according to the invention has a viscosity in the range of 10 to 500 Pa·s, preferably of 50 to 200 Pa·s. The viscosity is the material-dependent component of the frictional resistance which counters movement when adjacent liquid layers are displaced. According to Newton, the shear resistance in a liquid layer between two sliding surfaces arranged parallel and moved relative to one another is proportional to the velocity or shear gradient G. The proportionality factor is a material constant which is known as the dynamic viscosity and has the dimension m Pa·s. In Newtonian liquids, the proportionality factor is pressure- and temperature-dependent. The degree of dependence here is determined by the material composition. Liquids or substances having an inhomogeneous composition have non-Newtonian properties. The viscosity of these substances is additionally dependent on the shear gradient.

For the etching of fine structures, having line widths of <200 μm, by printed etching media, it has been found to be particularly advantageous to thicken etching media completely or partially using finely divided particulate systems. Particularly suitable for this purpose are polymer particles which interact with the other components of the composition and form a network by means of chemical bonds or a purely physical interaction at the molecular level. The relative particle diameters of these systems can be in the range from 10 nm to 30 μm. Corresponding polymer particles having a relative particle diameter in the range from 1 to 10 μm have proved particularly advantageous. Particles which are particularly suitable for the purpose according to the invention can consist of the following materials:

polystyrene
polyacrylic
polyamide
polyethylene
ethylene-vinyl acetate copolymer
ethylene-acrylic acid-acrylate terpolymer
ethylene-acrylate-maleic anhydride terpolymer
polypropylene
polyimide
polymethacrylate
melamine, urethane, benzoguanine, phenolic resin
silicone resin
fluorinated polymers (PTFE, PVDF), and
micronised waxes The use of a very finely divided polyethylene powder, which is, for example, currently marketed by DuPont PolymerPowders Switzerland under the trade name COATHYLENE HX® 1681, having relative particle diameters $d_{50}$ value of 10 μm, has proven particularly suitable in the experiments.

These particulate thickeners can be added to the etching medium in amounts in the range of 0.5 to 50% by weight, advantageously in the range of 0.5 to 40% by weight, in particular of 0.5 to 25% by weight.

Particularly appropriate are particulate polymeric thickeners based on polystyrene
polyacrylic
polyamide
polyimide
polymethacrylate
melamine, urethane, benzoguanine, phenolic resin and
silicone resin.

Instead of polymer particles the etching composition may comprise inorganic particles in the same amount or polymer particles may be replaced partially. Suitable inorganic particles are calcium fluoride, boron oxide and sodium chloride, carbon black, graphite and fumed silica. Preferably these inorganic particles show the same mean diameters in the range of 10 nm to 30 μm, most preferably in the range of 1 to 10 μm.

Experiments have shown that etching pastes according to the present invention are excellently adapted to be employed in a simplified etching method for polymer-surfaces:

Particulate thickening results in improved resilience of the etching medium. The particles form a skeleton-structure in the etching medium. Similar structures are known to the person skilled in the art from highly dispersed silicic acid (for example Aerosil®). In particular in screen printing of the etching pastes, a broadening of the printed structures due to flow can be substantially prevented or at least greatly restricted by the present invention. The printed and thus paste-covered area therefore corresponds substantially to the area specified in the screen layout.

The thickening associated with the addition of polymer particles according to the invention results in a low binding capacity of the etching paste. For a given specific choice of added particles, an unexpected etching rate and thus a considerably etching depth are achieved for the amount of added etching component.

Significant advantages in the present compositions arise, in particular, through an outstanding screen-printing behaviour, enabling continuous printing of surfaces to be treated without interruptions. The use of the etching pastes according to the invention enables surprisingly fine etching structures since the pastes have high viscosities on addition of a thickener in the presence of polymer particles. This enables the pastes to be applied in printing with a high paste layer and consequently for the layers to be etched deep, because the achieved printed height under printing conditions causes a delayed drying of the printed etching species. This enables the etching species to act on the substrate for a longer time. This is particularly important in the case of etching under elevated temperatures. In addition, the material remaining after the etching process can be removed easily in the final cleaning step and the good rinsing behaviour after etching leads to a short subsequent cleaning.

Surprisingly, experiments have shown that the addition of corresponding fine polymer particles also have an advantageous effect in processes for the selective etching of surfaces of transparent conductive polymer layers comprising AgNWs for the production of flexible photovoltaic devices. The same applies for conductive polymer layers comprising CNTs. Immediately after application to the surfaces to be etched, the treated composite material is heated over the entire surface to temperatures in the range of 20 to 170° C. for a period of time lasting for several seconds to 15 minutes, in particular to temperatures in the range of 20 to 60° C., for 30 s to 7 minutes. Especially preferred are low temperature treatments in the range of 20 to 30° C. The selected temperature is of course set in such a way that changes in the particles present in the paste do not give rise to any disadvantages.

It has been found that an acidic etchant, like $NH_4HF_2$, $NH_4F$, HF, $HBF_4$ or $H_3PO_4$ and other compounds which lead to a low pH value of less than 3 in aqueous solution are capable of completely removal of AgNW comprising conductive, transparent polymer or glass layers having a layer thickness of several hundred nm within a few seconds to minutes at temperatures in the range between 20° C. to 170° C. At 20° C., the etching time is about 1 to 15 minutes. Unexpectedly the conditions for the removal of CNTs comprising conductive polymer layers are comparable.

For the preparation of the particle-containing etching composition according to the invention, the solvents, etching components, thickeners, particles and additives are mixed successively with one another and stirred for a sufficient time until a viscous paste has formed. The stirring can be carried out with warming to a suitable temperature. Usually the components are stirred with one another at room temperature.

Preferred uses of the printable etching pastes according to the invention arise for the described processes for the structuring of AgNW comprising conductive, transparent polymer layers applied to a flexible support material, for the production of flexible photovoltaic devices, preferably solar cells.

For application of the pastes to the areas to be treated, the etching pastes can be printed through a fine-mesh screen which contains the print template (or etched metal screen). On use of the etching pastes according to the invention, the applied etching pastes are washed off with a suitable solvent or solvent mixture after a certain reaction time. The etching reaction is terminated by the washing-off.

Particularly suitable printing methods are essentially screen printing with screen separation or stencil printing without separation. In screen printing, the separation of a screen is usually several hundred μm with a tilt angle α between the edge of the squeegee, which pushes the etching printing paste over the screen, and the screen. The screen is held by a screen frame, while the squeegee is passed over the screen at a squeegee velocity v and a squeegee pressure P. In the process, the etching paste is pushed over the screen. During this operation, the screen comes into contact with the substrate in the form of a line over the squeegee width. The contact between screen and substrate transfers the vast majority of the screen printing paste located in the free screen meshes onto the substrate. In the areas covered by the screen meshes, no screen printing paste is transferred onto the substrate. This enables screen printing paste to be transferred in a targeted manner to certain areas of the substrate.

After the end of the movement E, the squeegee is raised off the screen. The screen is tensioned uniformly using a screen stretcher with hydraulic/-pneumatic tension and clamping device. The screen tension is monitored by defined sag of the screen in a certain area at a certain weight using a dial gauge. With specific pneumatic/hydraulic printing machines, the squeegee pressure (P), the printing velocity (V), the off-contact distance (A) and the squeegee path (horizontal and vertical, squeegee angle) can be set with various degrees of automation of the working steps for trial and production runs.

Printing screens used here usually consist of plastic or steel-wire cloth. It is possible for the person skilled in the art to select cloths having different wire diameters and mesh widths, depending on the desired layer thickness and line width. These cloths are structured directly or indirectly using photosensitive materials (emulsion layer). For the printing of extremely fine lines and in the case of requisite high precision of successive prints, it may be advantageous to use metal stencils, which are likewise provided directly or indirectly with a hole structure or line structure. If necessary, flexible printing devices may be used for the application of the etching composition.

In order to carry out the etching, an etching paste is prepared, as described i.e. in Example 1. Using an etching paste of this type, a AgNW substrate having a thickness of approximately 100 nm can be removed within 1 minutes at 20° C. after screen printing. The etching is subsequently terminated by dipping the devise into water and then rinsing with the aid of a fine water spray.

LIST OF FIGURES

FIG. 1 shows the measured etching profile achieved with a composition according to example 1 and where a AgNW comprising polymer layer is etched at room temperature for 1 minute. The figure shows the graph of the profile depth against the width.

Figure 2:
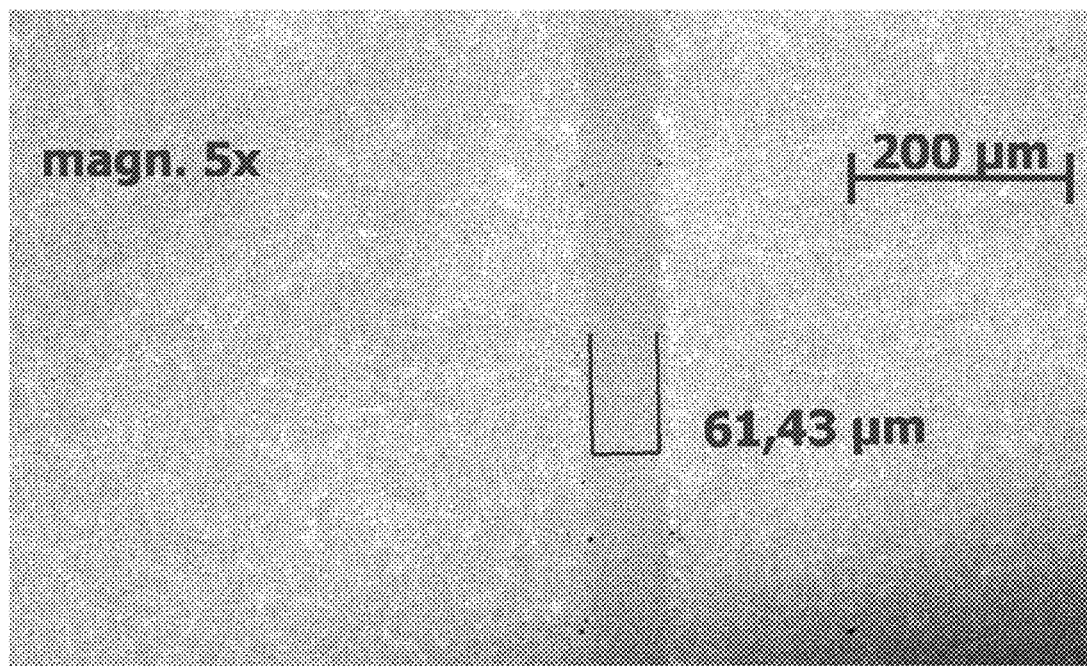

FIG. 2 shows a micrograph of the etching result of example 1, where a AGNW comprising polymer layer is etched at 120° C. for 10 min with an etching composition prepared according to example 1. The paste is screen printed.

For better understanding and in order to illustrate the invention, examples are given below which are within the scope of protection of the present invention. These examples also serve to illustrate possible variants. Owing to the general validity of the inventive principle described, however, the examples are not suitable for reducing the scope of protection of the present application to these alone.

The temperatures given in the examples are always in ° C. It furthermore goes without saying that the added amounts of the components in the composition always add up to a total of 100% both in the description and in the examples.

The present description enables the person skilled in the art to use the invention comprehensively. If anything is unclear, it goes without saying that the cited publications and patent literature should be used. Correspondingly, these documents are regarded as part of the disclosure content of the present description and the disclosure of cited literature, patent applications and patents is hereby incorporated by reference in its entirety for all purposes.

EXAMPLES

The acidic etchant, preferably ammoniumhydrogendifluoride, is mixed with the solvent in a beaker with a magnetic stirrer, the thickener is slowly added while stirring the mixture. Then the required filler quantity is added while stirring the mixture.

Example 1

Best Mode 15 g Ethylenglycolmonobutylether
15 g Triethylenglycolmonomethylether
29 g Polycarbonat
72 g Ameisensäure
30 g DI Water
16 g Ammoniumhydrogendifluorid
46 g Polyvinylpyrrolidon (PVP) K-120
60 g Vestosint 2070

The compounds are successively mixed with each other. After standing for some hours the paste can be printed.

FIG. 1 shows the measured etching profile achieved with a composition according to example 1 and where a AgNW comprising polymer layer is etched at room temperature for 1 minute.

Example 2

30 g Ethylenglycol
29 g Polycarbonat
72 g Ameisensäure (100%)
30 g DI Water
8 g Ammoniumhydrogendifluorid
8 g Polyvinylpyrrollidone
75 g Vestosint 2070

Example 3

33 g $H_3PO_4$
36 g 1-Methyl-2-pyrrolidone
13 g DI Water
8 g Polyvinylpyrollidone
3 g Graphite The etching composition is mixed as described above. The result is a printable etching composition.

Example 4

26 g Ethylenglycol
24 g Polycarbonat
30 g DI Water
3 g Ammoniumhydrogendifluorid
6 g Polyvinylpyrollidone
26 g Vestosint 2070

The prepared etching composition is screen printed onto the surface of a AgNW comprising polymer layer, which is supported on a flexible PET substructure or solid glass sheet. After dwell time of 1 min at room temperature, the PET film or glass sheet has to be cleaned by water jet.

FIG. 2 shows a micrograph of the etching result of example 1, where a AgNW comprising polymer layer is etched at 120° C. for 10 min with a composition according to example 1. The paste is screen printed.

These etching results illustrate, that for good results the concentration of the comprising etchant, the amount of the applied etching paste, etching time and temperature have to be optimized for different layers and layer-thicknesses.

The etching paste is printed onto the substrate by screen printing. Other ways of printing the etching paste with the above described printing methods are possible as described before.

The invention claimed is:

1. A method for selective etching of a polymer matrix comprising silver nanowires and/or carbon nano tubes on a plastic or glass substructure, said method comprising:
   a) printing an acidic based etching paste onto the surface of a substrate formed of a composite material comprising said polymer matrix with silver nanowires and/or carbon nano tubes and said plastic or glass substructure, wherein said etching paste comprises an etchant selected from $NH_4HF_2$ $NH_4F$, HF, and $HBF_4$,
   b) etching for a predetermined period of time, with or without heating, and
   c) cleaning said substrate.

2. A method according to claim 1, wherein in a) said etching paste comprises a solvent selected from water, mono- or polyhydric alcohols, ethers esters, esters of carbonic acid, ketones, and aldehydes, as such or mixtures thereof, in an amount in the range of 10 to 90% by weight based on the total amount of the etching paste.

3. A method according to claim 1, wherein in a) said etching paste comprises ethylene glycol as solvent.

4. A method according to claim 1, wherein in a) said etching paste comprises organic or inorganic particles or mixtures thereof in an amount in the range of 0.5 to 25% by weight, based on the total amount of the etching paste.

5. A method according to claim 1, wherein in a) said etching paste comprises organic polymer particles selected from polystyrene, acrylic polymers, polyamides, polyimides, methacrylic polymers, melamine, urethane, benzoguanine and phenolic resins, silicone resins, micronized cellulose, fluorinated polymers, and micronized wax.

6. A method according to claim 1, wherein in a) said etching paste comprises inorganic particles selected from calcium fluoride, boron oxide, carbon black, graphite, fumed silica, and sodium chloride.

7. A method according to claim 1, wherein in a) said etching paste is applied onto said surface by screen printing, inkjetting, dispensing, or micro-jetting.

8. A method according to claim 1, wherein during said etching said substrate is heated for 10 s -15 min, at a temperature of 20 to 170° C.

9. A method according to claim 1, wherein during said etching said substrate is heated for 5 minutes at 30° C.

10. A method according to claim 8, wherein during said cleaning the treated substrate is rinsed with DI water or with a solvent; and dried with dry air or nitrogen flow.

11. A method according to claim 1, wherein said plastic is polyurethane, polyethylene naphthalate, or polyethylene terephthalate.

12. A method according to claim 1, wherein the silver nano wires are embedded in conductive polymer layers and have lengths from 1.5 to 15 μm and diameters from 40-150 nm.

13. A method according to claim 1, wherein the carbon nano tubes are embedded in conductive polymer layers and have lengths in the range of 1.5 to 15 μm and mean diameters in the range of 40-150 nm.

14. A method according to claim 1, wherein said polymer matrix contains conductive polymers selected from poly(3- octylthiophene), poly(3-hexyl-thiophene) polymer, poly(3,4-ethylene dioxythiophene), and polyanilines.

15. A method according to claim 1, wherein resolution of the resultant printed lines, dots or structures is less than 80 μm.

16. A method according to claim 2, wherein in said etching paste comprises a solvent selected from glycerol, 1,2-propanediol, 1,2-ethandiol, 2-propanol, 1,4-butanediol, 1,3-butanediol, 1,5-pentanediol, 2-ethyl-l-hexenol, ethylene glycol, diethylene glycol, dipropylene glycol, ethylene glycol monobutyl ether, triethylene glycol monomethyl ether, diethylene glycol monobutyl ether, dipropylene glycol monomethyl ether, [2,2-butoxy(ethoxy)]ethyl acetate, isopropyl acetate, isopropyl formate, propylene carbonate, acetone, 2-butanone, acetophenone, methyl-2-hexanone, 2-octanone, 4-hydroxy-4-methyl-2-pentanone, 1-methyl-2-pyrrolidone, caprolactam, 1,3-dioxolan, 2-methyl-1,3-dioxolane, and acetaldehyde, as such or mixtures thereof, in an amount in the range of 10 to 90% by weight based on the total amount of the etching paste.

17. A method according to claim 1, wherein in a) said etching paste comprises said solvent in an amount in the range of 15 to 85% by weight based on the total amount of the etching paste.

18. A method according to claim 16, wherein in a) said etching paste comprises said solvent in an amount in the range of 15 to 85% by weight based on the total amount of the etching paste.

19. A method according to claim 1, wherein during said etching said characterized in that the heating of the substrate is heated for 30 s to 7 min at a temperature of 20 to 170° C.

20. A method according to claim 1, wherein said polymer matrix contains conductive polymers selected from polythiophene polymers.

21. A method according to claim 1, wherein said polymer matrix contains a combination of conductive polymers selected from poly[2-methoxy-5-(3',7'-dimethyloctyloxy) 1,4-phenylene vinylene]/1-(3-methoxycarbonyl)-propyl-1-phenyl)[6,6]$C_{61}$; poly(3-hexyl-thiophene)polymer/1-(3-methoxycarbonyl)-propyl-1-phenyl)[6,6]$C_{61}$; and poly(3,4-ethylene dioxythiophene)/poly(styrene sulfonate).

22. A method according to claim 1, wherein in a) said etching paste comprises organic or inorganic particles or mixtures thereof in an amount in the range of 0.5 to 25% by weight, based on the total amount of the etching paste,
wherein said organic particles are organic polymer particles selected from polystyrene, acrylic polymers, polyamides, polyimides, methacrylic polymers, melamine, urethane, benzoguanine and phenolic resins, silicone resins, micronized cellulose, fluorinated polymers and micronized wax, and
wherein said inorganic particles are selected from calcium fluoride, boron oxide, carbon black, graphite, fumed silica and sodium chloride.

23. A method according to claim 1, wherein said etchant is $NH_4HF_2$.

* * * * *